(12) United States Patent
Briggs et al.

(10) Patent No.: US 10,170,411 B2
(45) Date of Patent: *Jan. 1, 2019

(54) AIRGAP PROTECTION LAYER FOR VIA ALIGNMENT

(71) Applicant: INTERNATIONAL BUSINESS MACHINES CORPORATION, Armonk, NY (US)

(72) Inventors: Benjamin D. Briggs, Waterford, NY (US); Lawrence A. Clevenger, LaGrangeville, NY (US); Christopher J. Penny, Saratoga Springs, NY (US); Michael Rizzolo, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/878,760

(22) Filed: Jan. 24, 2018

(65) Prior Publication Data

US 2018/0151491 A1    May 31, 2018

Related U.S. Application Data

(63) Continuation of application No. 15/337,130, filed on Oct. 28, 2016, now Pat. No. 9,929,088, which is a continuation of application No. 15/130,166, filed on Apr. 15, 2016, now Pat. No. 9,553,019.

(51) Int. Cl.
*H01L 21/768*   (2006.01)
*H01L 23/522*   (2006.01)
*H01L 23/532*   (2006.01)

(52) U.S. Cl.
CPC ...... *H01L 23/5226* (2013.01); *H01L 21/7682* (2013.01); *H01L 21/76816* (2013.01); *H01L 21/76819* (2013.01); *H01L 21/76829* (2013.01); *H01L 21/76832* (2013.01); *H01L 21/76834* (2013.01); *H01L 21/76879* (2013.01); *H01L 21/76897* (2013.01); *H01L 23/5222* (2013.01);
(Continued)

(58) Field of Classification Search
CPC .................. H01L 21/7682; H01L 21/76829
USPC .................... 257/752; 438/619, 626, 634
See application file for complete search history.

(56) References Cited

U.S. PATENT DOCUMENTS

| | | | |
|---|---|---|---|
| 5,652,176 A | 7/1997 | Maniar et al. | |
| 6,387,797 B1 * | 5/2002 | Bothra | H01L 21/7682 |
| | | | 257/E21.581 |
| 6,406,975 B1 | 6/2002 | Lim et al. | |

(Continued)

OTHER PUBLICATIONS

List of IBM Patents or Patent Applications Treated as Related dated Jan. 24, 2018, 2 pages.

*Primary Examiner* — George Fourson, III
(74) *Attorney, Agent, or Firm* — Tutunjian & Bitetto, P.C.; Jennifer Davis (57) ABSTRACT

A method for via alignment includes forming first airgaps between interconnect structures and depositing a pinch off layer to close off openings to the first airgaps. A protection layer is formed in divots in the pinch off layer. The protection layer and the pinch off layer are planarized to form a surface where the protection layer remains in the divots. An interlevel dielectric layer (ILD) is deposited on the surface. The ILD and the pinch off layer are etched using the protection layer as an etch stop to align a via and expose the interconnect structure through the via.

20 Claims, 13 Drawing Sheets

(52) U.S. Cl.
CPC .... *H01L 23/5329* (2013.01); *H01L 23/53295* (2013.01)

(56) References Cited

U.S. PATENT DOCUMENTS

| | | |
|---|---|---|
| 7,088,003 B2 | 8/2006 | Gates et al. |
| 7,094,689 B2 | 8/2006 | Su et al. |
| 7,666,754 B2 | 2/2010 | Toma et al. |
| 7,855,123 B2 | 12/2010 | Lee et al. |
| 8,383,507 B2 | 2/2013 | Chanda et al. |
| 8,450,789 B2 | 5/2013 | Bicksler et al. |
| 2013/0323930 A1 | 12/2013 | Chattopadhyay et al. |
| 2015/0170956 A1 | 6/2015 | Naik et al. |

\* cited by examiner

AIRGAP PROTECTION LAYER FOR VIA ALIGNMENT

BACKGROUND

Technical Field

The present invention relates to semiconductor processing, and more particularly to semiconductor devices and methods for fabrication having an airgap protection layer for via placement and alignment.

Description of the Related Art

Current integration schemes for airgap processing require that no gaps are formed around vias landing on a metal level that is gapped. In dense circuit structures, this restriction can significantly limit the area that is able to be gapped. Additionally, the gaps are placed on consecutive levels, and the risk that the gaps will merge and cause significant defectivity exists. Further, wide lines or other structures etched deeper than standard lines can encroach on an airgap therebelow, which can lead to shorts or other defectivity problems. Protecting the metal lines during the formation of an airgap does not presently include a way to specifically protect the airgap from either the via landing on the metal or from the airgap or metal line above.

SUMMARY

A method for via alignment includes forming first airgaps between interconnect structures and depositing a pinch off layer to close off openings to the first airgaps. A protection layer is formed in divots in the pinch off layer. The protection layer and the pinch off layer are planarized to form a surface where the protection layer remains in the divots. An interlevel dielectric layer (ILD) is deposited on the surface. The ILD and the pinch off layer are etched using the protection layer as an etch stop to align a via and expose the interconnect structure through the via.

Another method for via alignment includes forming interconnect structures in a first dielectric layer; etching first airgaps between the interconnect structures; depositing a pinch off layer to close off openings to the first airgaps; forming a protection layer in divots formed in the pinch off layer; planarizing the protection layer and the pinch off layer to form a surface where the protection layer remains in the divots; depositing an interlevel dielectric layer (ILD) on the surface; etching the ILD and the pinch off layer using the protection layer as an etch stop to form and align a via and expose the interconnect structure through the via; forming trenches in the ILD with at least one trench in communication with the via; depositing a conductive material in the trenches and the via; and etching second airgaps between the trenches.

A semiconductor device includes first airgaps formed between interconnect structures in a first dielectric layer. A pinch off layer is formed to close off openings to the first airgaps. A protection layer is formed in divots in the pinch off layer over the first airgaps. An interlevel dielectric layer (ILD) is formed over a planarized surface of the pinch off layer and the protection layer. A via opening is formed between portions of the protection layer to align the via opening with the interconnect structure.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

In accordance with the present principles, structures, devices and methods are provided that include a protection mechanism for airgap formation. An airgap protection layer is formed immediately after airgap pinch off. The pinch off can be provided with a dielectric cap or with a dielectric cap plus a thin interlevel dielectric (ILD) deposition. After the deposition of the pinch off material, the protective layer is deposited. The protective layer may include materials, such as, e.g., AlN, although alternate materials may be employed. The protective layer is then polished to planarize the structure as well as remove the protective layer in higher regions over trenches. A next interconnect level is then formed. The protective layer will function to align vias landing on a metal of the next interconnect level, as well as protect the airgap from next level airgaps or deep trenches.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$, where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGs. It will be understood that the spatially relative terms are intended to encompass different orientations of the device in use or operation in addition to the orientation depicted in the FIGs. For example, if the device in the FIGs. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Figure 1:
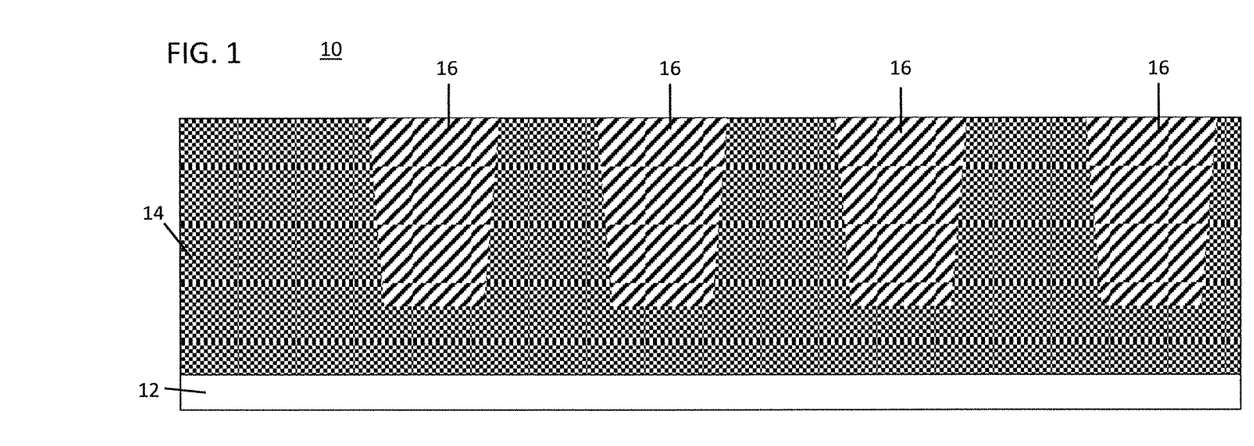
FIG. 1 is a cross-sectional view of a semiconductor device showing an interconnect structure formed in a dielectric layer on a substrate in accordance with the present principles.

Referring now to the drawings in which like numerals represent the same or similar elements and initially to FIG. 1, a cross-sectional view of a structure 10 is illustratively shown for an interconnection level in accordance with the present principles. A layer 12 may represent a previous metallization layer or may represent a substrate having semiconductor components (e.g., transistor, etc.) formed therein. The layer 12 may include any structure where repeating metallization structures are to be connected. A dielectric layer 14 is formed on the layer 12. The dielectric layer 14 may include an interlevel dielectric (ILD) layer where vias or contacts are formed therethrough. The dielectric layer 14 may include any suitable dielectric materials.

In one embodiment, the dielectric layer 14 may include an ultra-low dielectric constant (ULK) material or higher dielectric constant materials, such as, e.g., octamethylcyclotetrasiloxane (OMCTS), tetraethyl orthosilicate (TEOS), hydrogen silsesquioxane (HSQ), polyamide or porous versions of other dielectric materials (e.g., silicon oxides, etc.). A low-K dielectric is considered a material with a dielectric constant less than 3.9 (the dielectric constant of silicon dioxide), an ultra low-K dielectric refers to a dielectric constant much smaller than 3.9, and a high-κ dielectric is a material with a dielectric constant greater than 3.9.

The dielectric layer 14 may be formed by a spin-on process, chemical vapor deposition or any other suitable process. A plasma-enhanced chemical vapor deposition (PECVD) may be employed for depositing silicon dioxide ($SiO_2$), fluorine-doped oxides ($F—SiO_2$), carbon-doped oxides (SiCOH) and porous carbon-doped oxides (p-SiCOH). PECVD materials including additional porosity (p-SiCOH) may be employed for back end of the line (BEOL) applications.

After the formation of the dielectric layer 14, a lithographic patterning process may be performed to pattern the dielectric layer 14 to form openings for the deposition of conductive materials. The conductive materials are deposited in the openings, and a planarization process, such as, e.g., a chemical mechanical polish (CMP) may be performed to form interconnect structures 16. The interconnect structures 16 may include polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotubes, conductive carbon, graphene, or any suitable combination of these materials. The conductive material of the interconnect structures 16 may further comprise dopants that are incorporated during or after deposition. In particularly useful embodiments, the interconnect structures 16 include copper.

Figure 2:
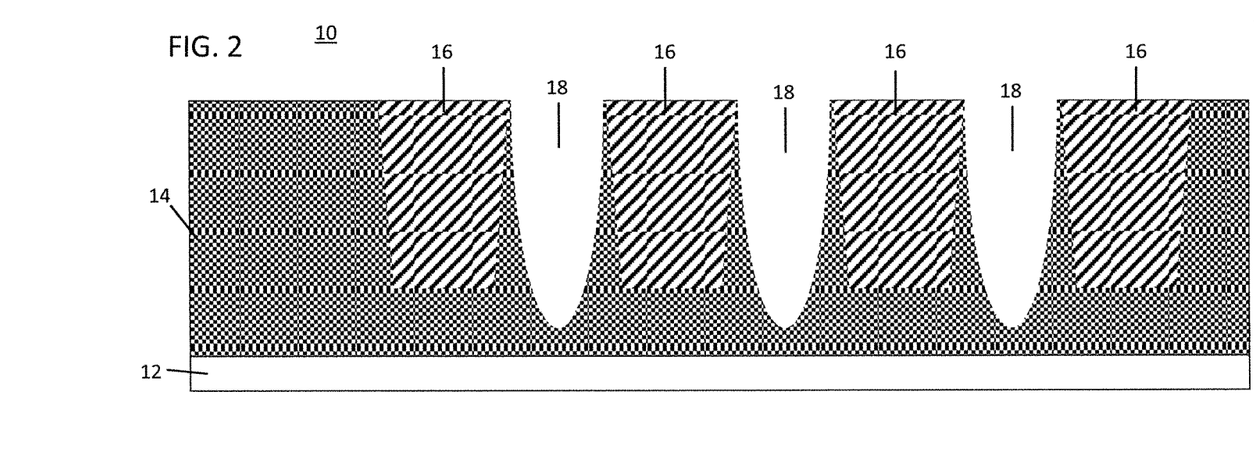
FIG. 2 is a cross-sectional view of the semiconductor device of FIG. 1 showing interconnect structures with airgaps formed in the dielectric layer between the interconnect structures in accordance with the present principles.

Referring to FIG. 2, an airgap formation process is performed to form airgaps 18 between the interconnect structures 16. In one embodiment, a selective etch process is performed to remove the dielectric layer 14 in between the interconnect structures 16. In one embodiment, a lithographic mask may be employed as an etch mask to protect some regions against the etching process. The etching process may include a reactive ion etch (RIE) process although other etching processes may be employed. The airgaps 18 preferably extend to a position below the interconnect structures 16.

Figure 3:
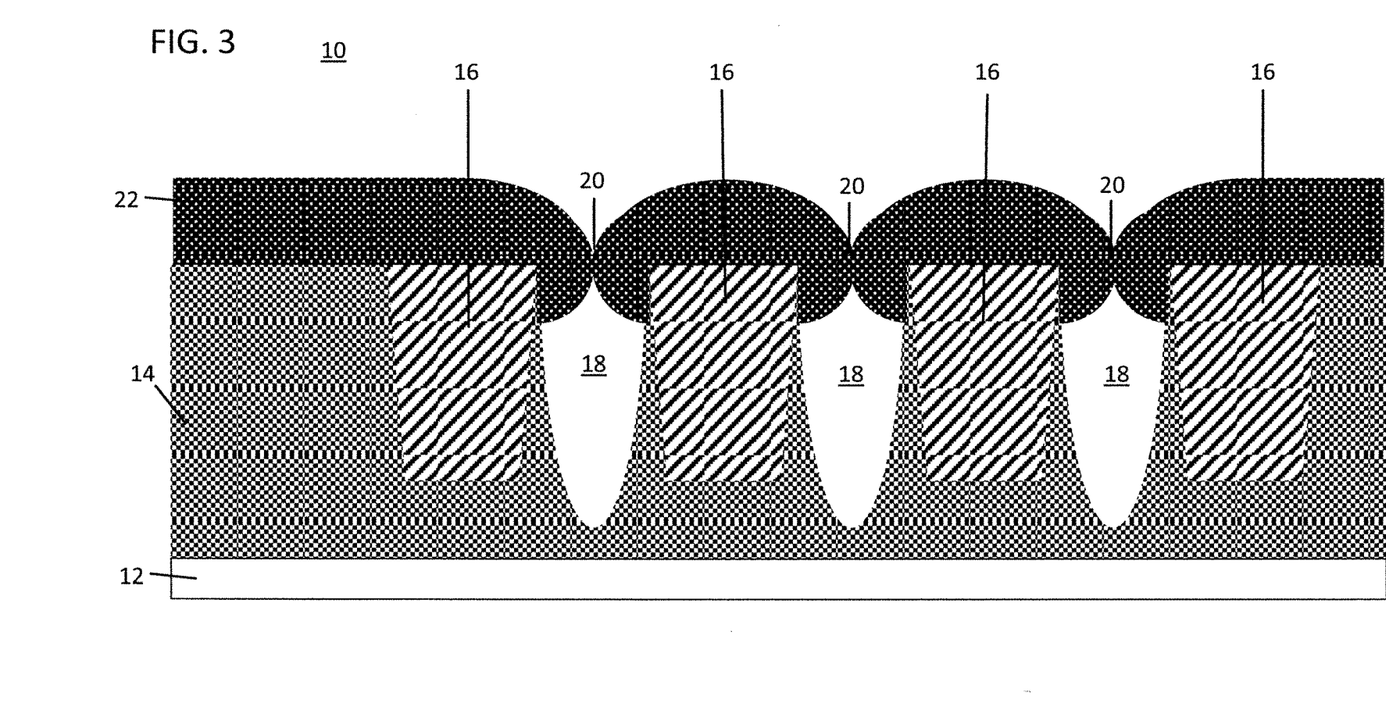
FIG. 3 is a cross-sectional view of the semiconductor device of FIG. 2 showing a pinch off layer pinching off the airgaps formed in the dielectric layer between the interconnect structures in accordance with the present principles.

Referring to FIG. 3, a pinch off layer 22 is formed over the interconnect structures 16 to pinch off trenches formed by airgaps 18. As the pinch off layer 22 is being deposited, the material of the pinch off layer 22 begins to close or pinch off the openings to the airgaps 18. The pinch off layer 22 growth preferably continues until the airgaps 18 are nearly or completely closed off. The pinch off layer 22 may include a nitride material, nitrogen-doped silicon carbide (NBLOK), a dielectric layer of a next level in the structure or a combination of one or more of these materials. The formation of the pinch off layer 22 also forms divot regions 20. The divot regions 20 form over the airgaps 18 and provide a space where additional material may be deposited.

Figure 4:
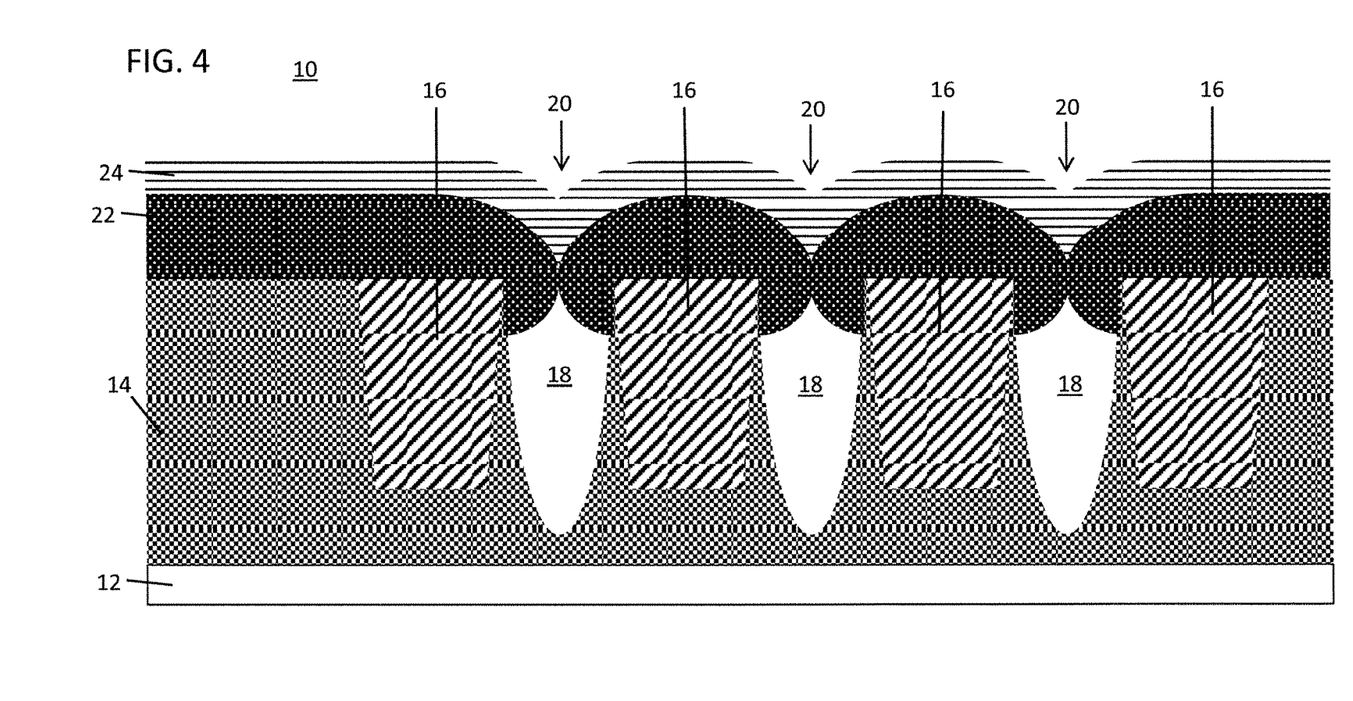
FIG. 4 is a cross-sectional view of the semiconductor device of FIG. 3 showing a protective layer formed on the pinch off layer in accordance with the present principles.

Referring to FIG. 4, a protection layer 24 is deposited over the pinch off layer 22. The deposition of the protection layer 24 may be conformal or non-conformal. The protection layer 24 should have a thickness sufficient to completely fill the divots 20. The protection layer 24 may include, e.g., AlN or other nitrides, although other materials may be selected. Materials selected for the protection layer 24 preferably include etch resistance when etching ILD layers, etc. in subsequent processing.

Figure 5:
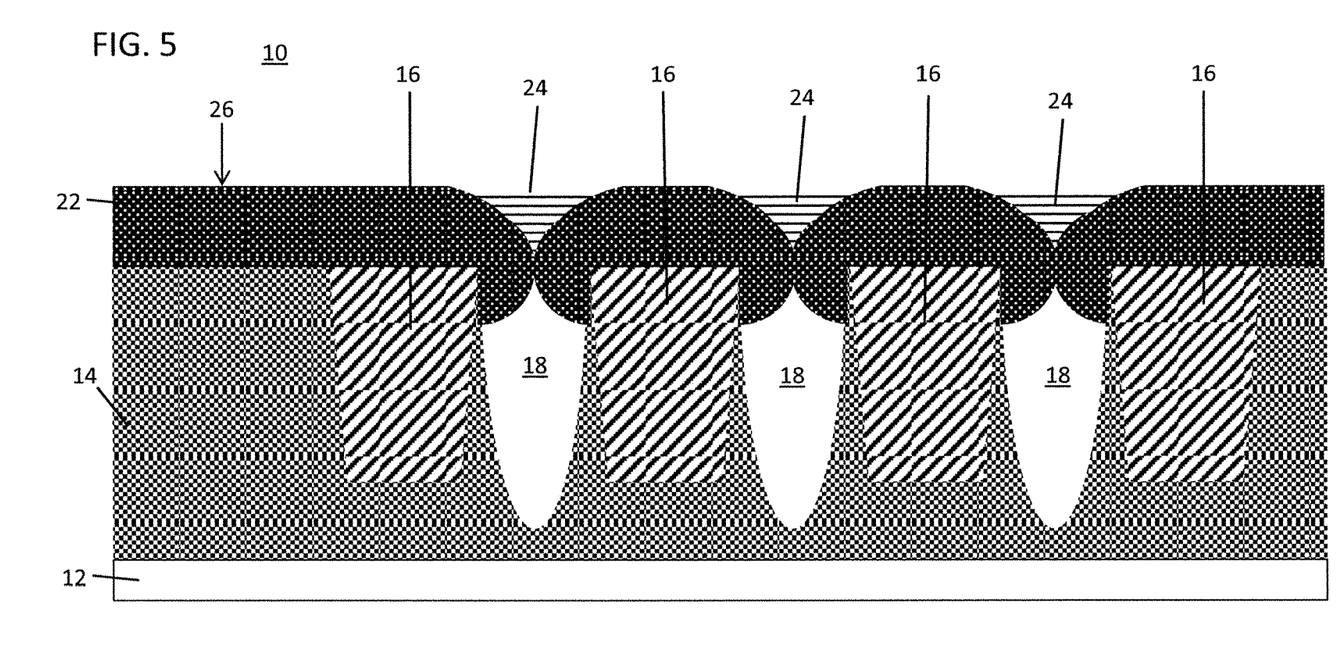
FIG. 5 is a cross-sectional view of the semiconductor device of FIG. 4 showing the protective layer and the pinch off layer planarized wherein the protection layer remains in the divots of the pinch off layer over the airgaps in accordance with the present principles.

Referring to FIG. 5, a planarization process is performed to planarize a top surface of the structure 10. A CMP process may be performed to planarize the protection layer 24 down to the pinch off layer 22 to form a surface 26. The protection layer 24 fills the divot areas over the airgaps 18.

Figure 6:
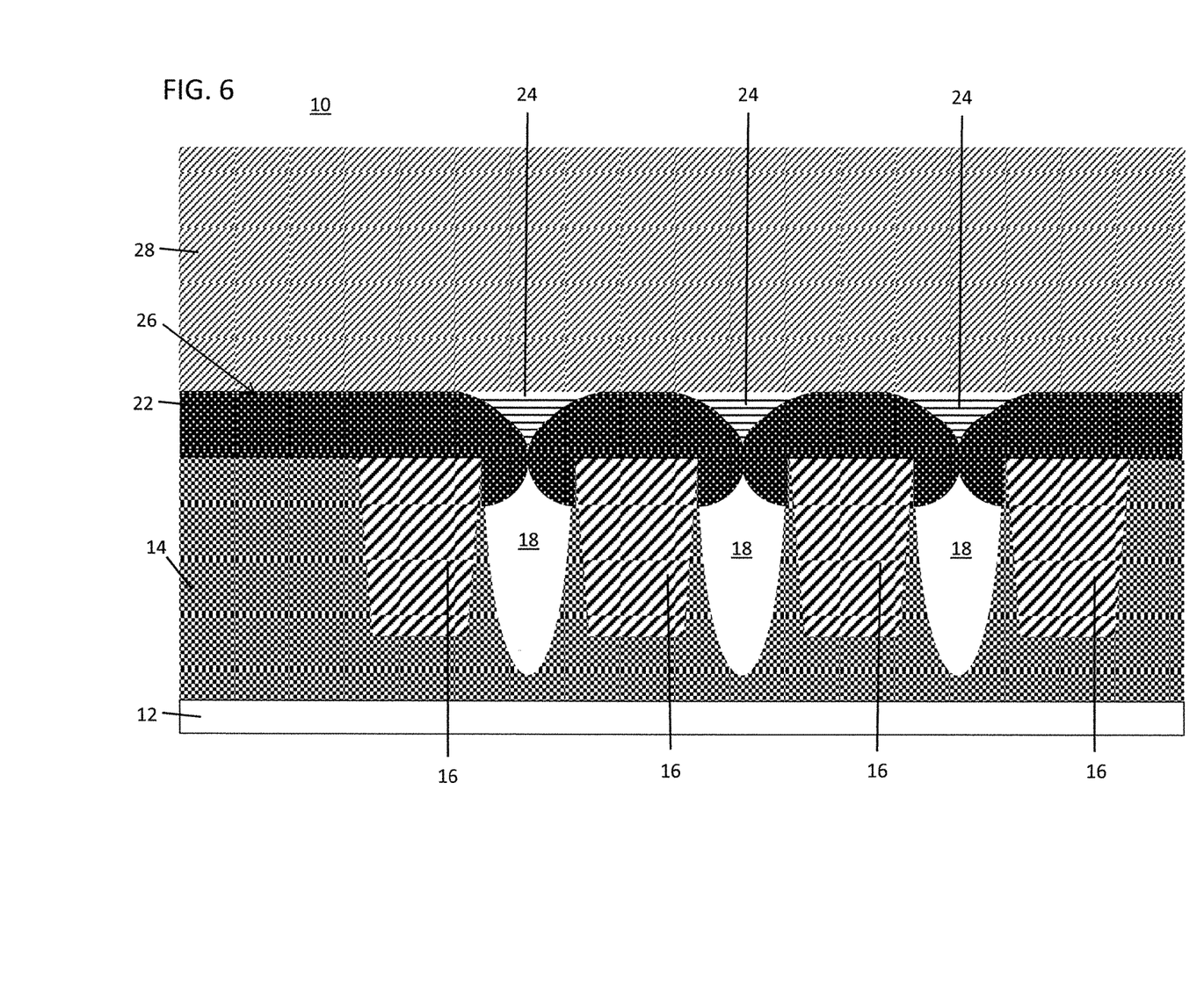
FIG. 6 is a cross-sectional view of the semiconductor device of FIG. 5 showing an interlevel dielectric layer formed over the planarized protective layer and pinch off layer in accordance with the present principles.

Referring to FIG. 6, an ILD layer 28 is formed on the planarized surface 26 over the protection layer 24 and the pinch off layer 22. The ILD layer 28 may include an oxide, such as a silicon oxide, a silicate glass or other suitable dielectric material.

Figure 7:
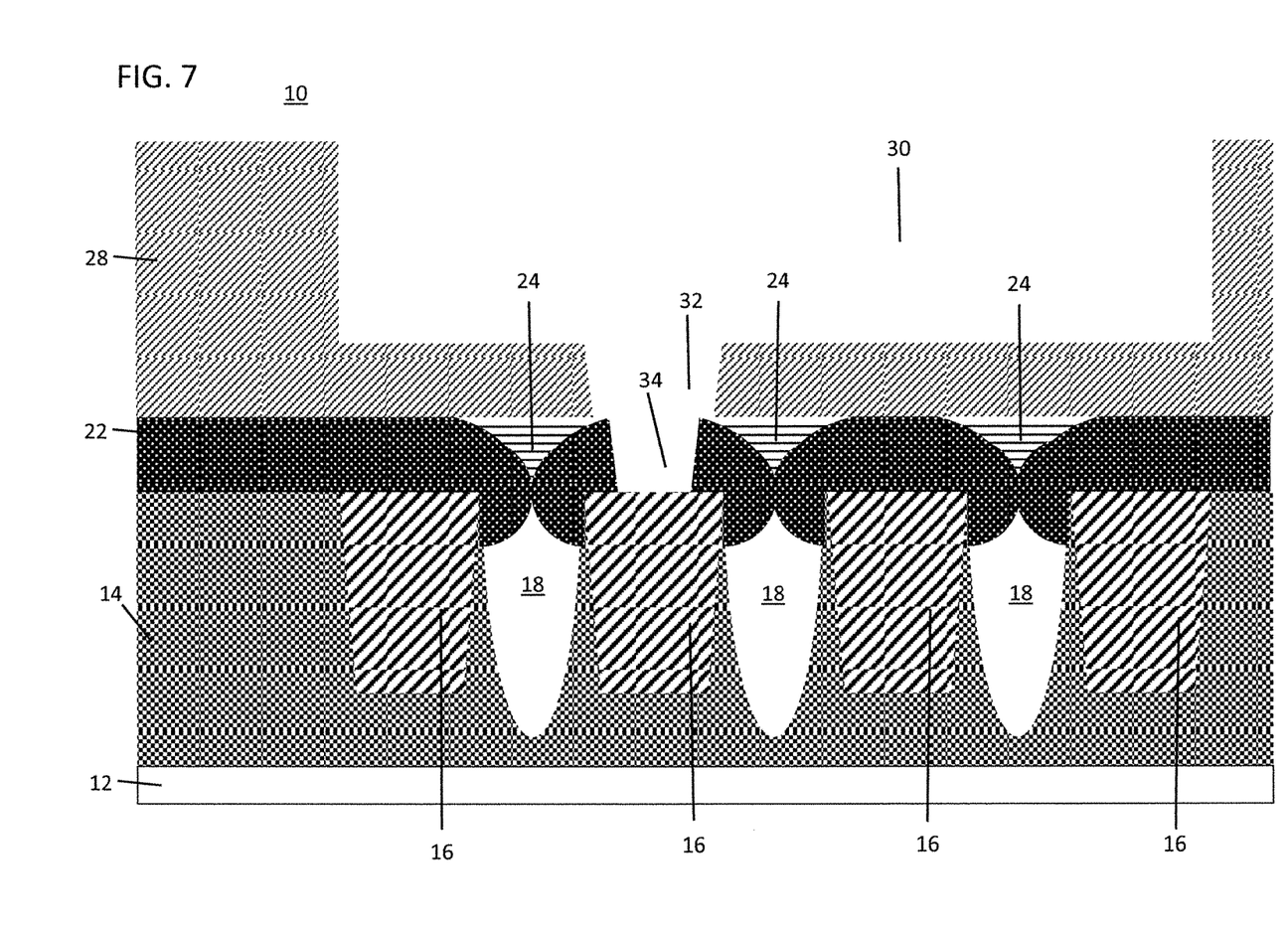
FIG. 7 is a cross-sectional view of the semiconductor device of FIG. 6 showing the interlevel dielectric layer patterned to form a self-aligned via and trench, the self-aligned via employing the protection layer as an etch stop in accordance with the present principles.

Referring to FIG. 7, the ILD layer 28 is patterned to form an opening 30 followed by opening 32 and opening 34 through the pinch off layer 22. The patterning of the ILD 28 may be performed in steps using one or more (e.g., two) lithography processes to expose the interconnect 16 through opening 34. In one embodiment, the lithography forms the openings 32 and 34 before opening 30. In another embodiment, the opening 30 is formed first, followed by openings 32 and 34. In any case, the ILD 28 is etched using a reactive ion etch (RIE) process or other etching process. The RIE process is selective to the material of the ILD 28 and the pinch off layer 22. In this way, the protection layer 24 acts as an etch stop to prevent the opening up of the divots where the protection layer 24 is over the airgaps 18. In addition, this permits the via etch to form opening 34 to be self-aligned. Since the protection layer 24 resists etching, the via/opening 34 opens up directly over the corresponding interconnect 16.

Figure 8:
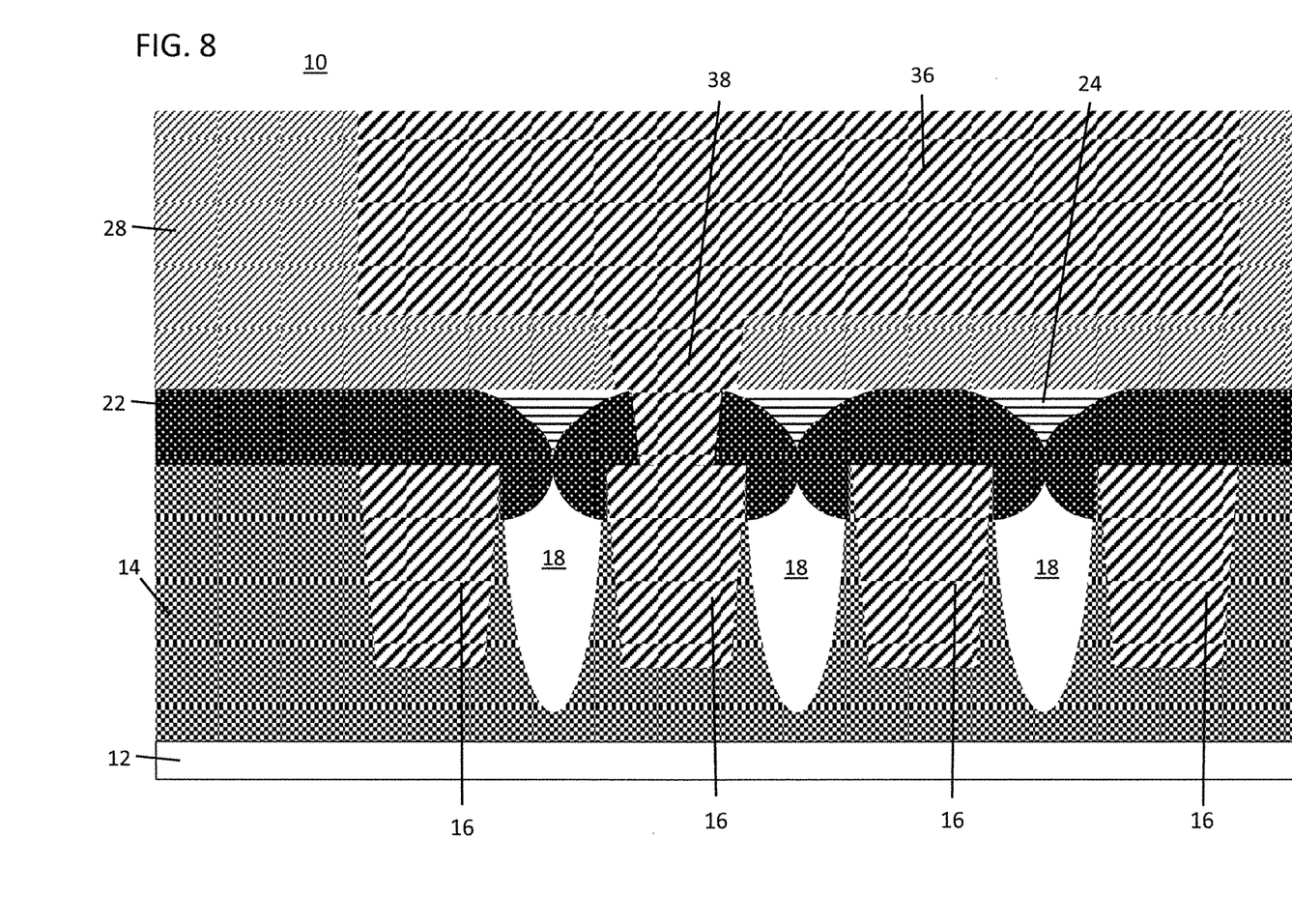
FIG. 8 is a cross-sectional view of the semiconductor device of FIG. 7 showing the conductive material fill and polish of the patterned interlevel dielectric layer and self-aligned via in the pinch off layer that employed the protection layer as an etch stop in accordance with the present principles.

Referring to FIG. 8, after the formation of the openings 30, 32, 34 in the dielectric of ILD 28, a conductive material is deposited in the openings 30, 32, 34, and a planarization process, such as, e.g., CMP may be performed to form interconnect structures 36 and 38. The interconnect structures 36, 38 may include polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotubes, conductive carbon, graphene, or any suitable combination of these materials. The conductive material of the interconnect structures 36, 38 may further comprise dopants that are incorporated during or after deposition. In a particularly useful embodiments, the interconnect structures 36, 38 may be formed in a dual damascene structure, or a contact structure 36 may be formed first followed by a metal line structure 38. In one particularly useful embodiment, the interconnect structures 36, 38 may be formed from copper.

Figure 9:
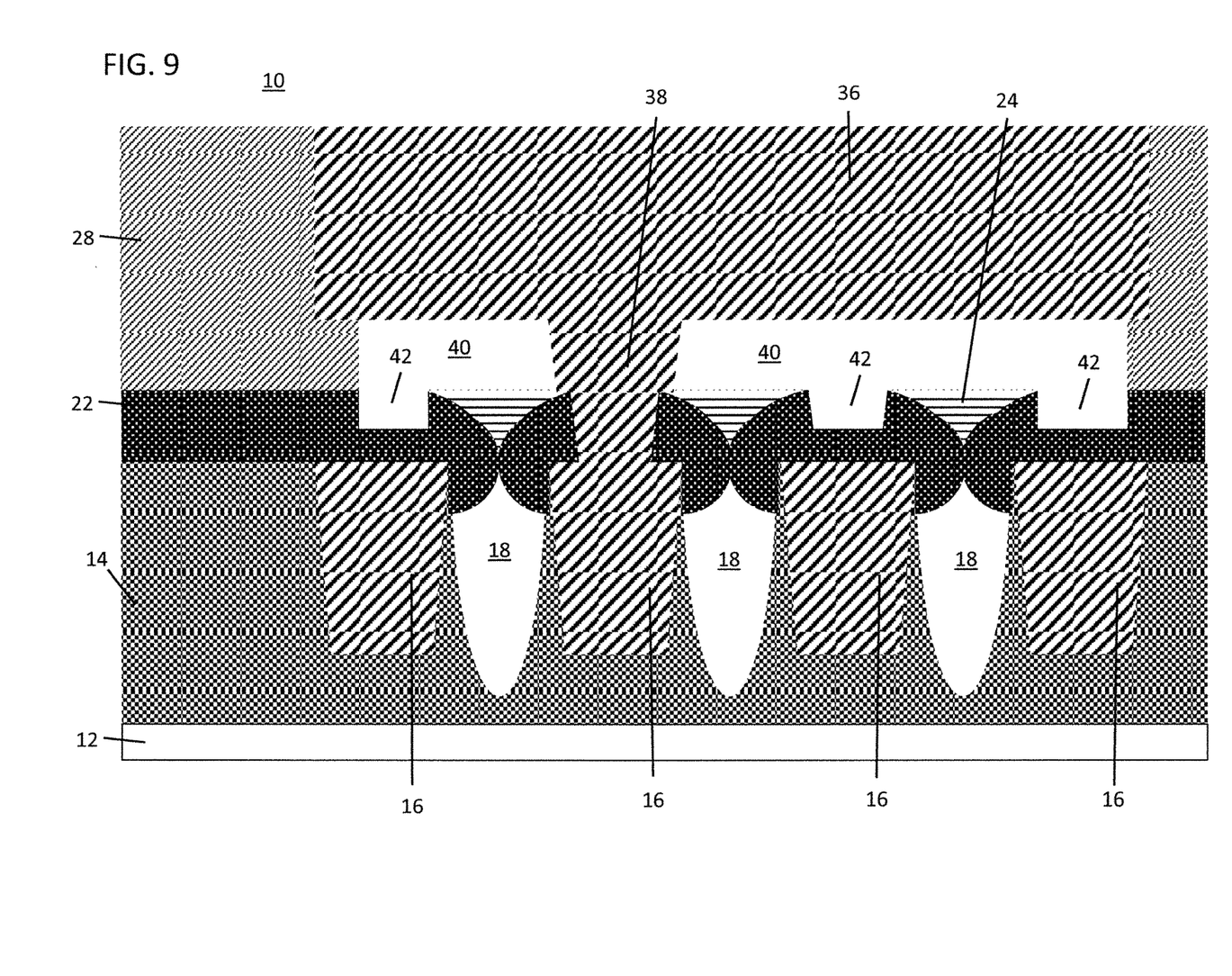
FIG. 9 is an out-of-plane cross-sectional view of the semiconductor device of FIG. 8 showing the via and the trench filled with conductive material and a position of another airgap between metal lines in accordance with the present principles.

Referring to FIG. 9, a complete interconnect structure level is illustratively shown. The structure 10 includes an additional airgap 40 formed about the via 38. The airgap 40 may be formed by an etch process that removes a lower portion of the ILD 28. The interconnect structure is out-of-plane to show the airgaps 18 and 40 relative to one another. ILD 28 is etched from the front or the back as will be described with reference to FIGS. 10-13. The etch process forms shallow trenches 42 during the airgap etch in areas not protected by the protection layer 24. In some embodiments, the etch to form airgaps 40 needs to be timed to ensure that sufficient coverage remains over the interconnects 16. In FIG. 9, the cross-section is illustratively taken out-of-plane (or at the very edge of the metal line 36) so that the airgap 40 is also shown with the metal line 36. In some embodiments, the airgap 40 is completely offset from the metal lines 36 as will be shown in FIGS. 10-13. The pinch off layer 22 and the protection layer 24 form a separation barrier between the first air gaps 18 and the second airgaps 40. This specifically protects the airgaps 18 and permits the via to land on the interconnects 16 and separates the airgaps 18 from the airgaps 40 and metal 36, 38.

Figure 10:
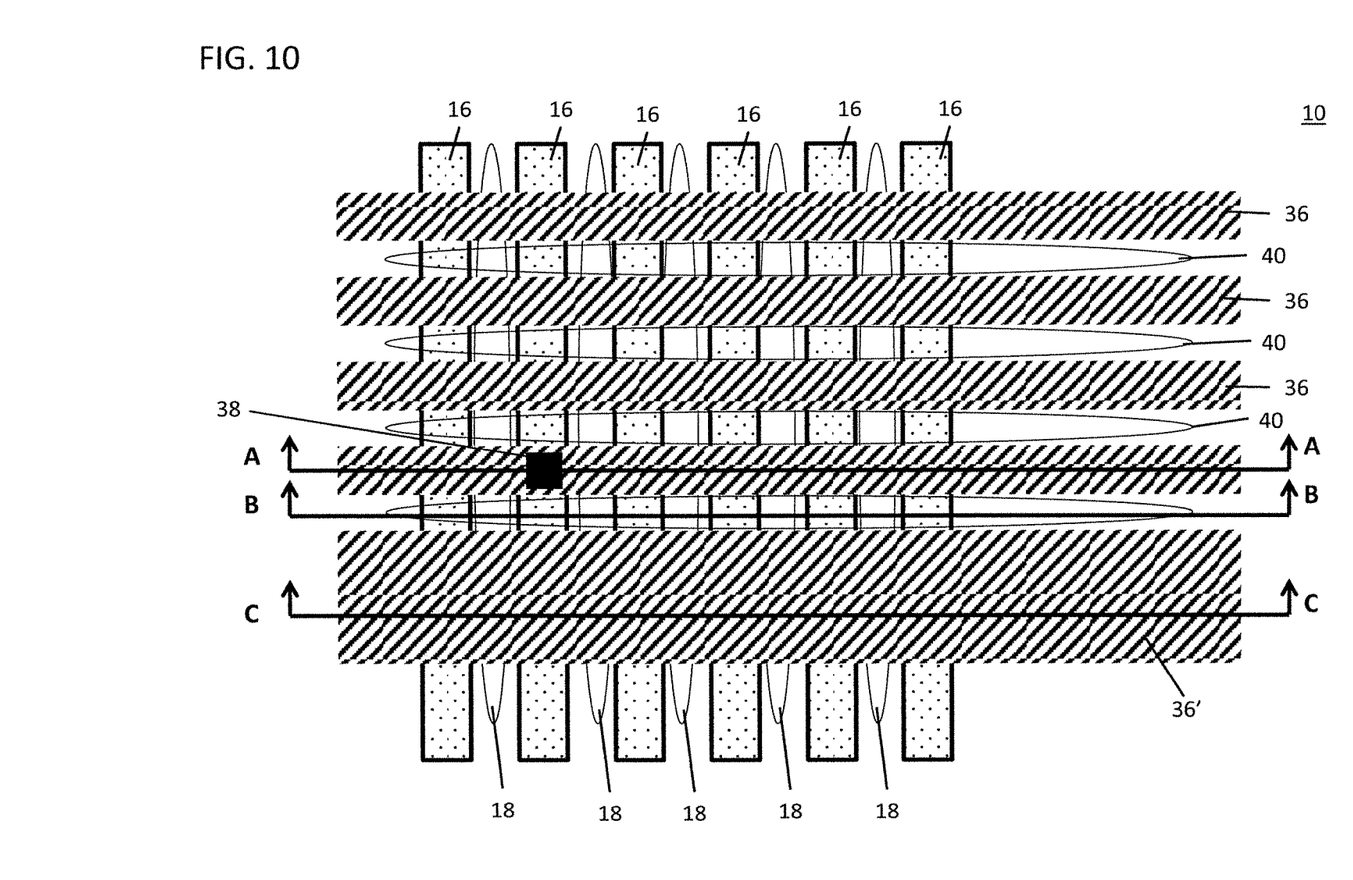
FIG. 10 is a top view of the semiconductor device of FIG. 9 showing an interconnect layer and a next metallization layer with respective airgaps in accordance with the present principles.

Referring to FIG. 10, a top view of the structure 10 is shown in accordance with one illustrative embodiment. The structure 10 shows the prior level airgaps 18 disposed between the interconnects 16. The airgaps 18 are protected by the protection layer 24 and the pinch off layer 22 (both not shown). The next level metal lines 36 are transversely disposed to the interconnects 16 and include airgaps 40 between the metal lines 36. The airgaps 40 are formed in the dielectric material of the ILD 28 between the metal lines 36. The protection layer 24 inhibits etching of the pinch off layer 22 during the airgap 40 etch process. In this way, shallow trenches 42 (FIG. 9) are formed by the airgap etch. In some embodiments, the etch to form airgaps 40 needs to be timed to ensure that sufficient coverage remains over the interconnects 16.

Figure 11:
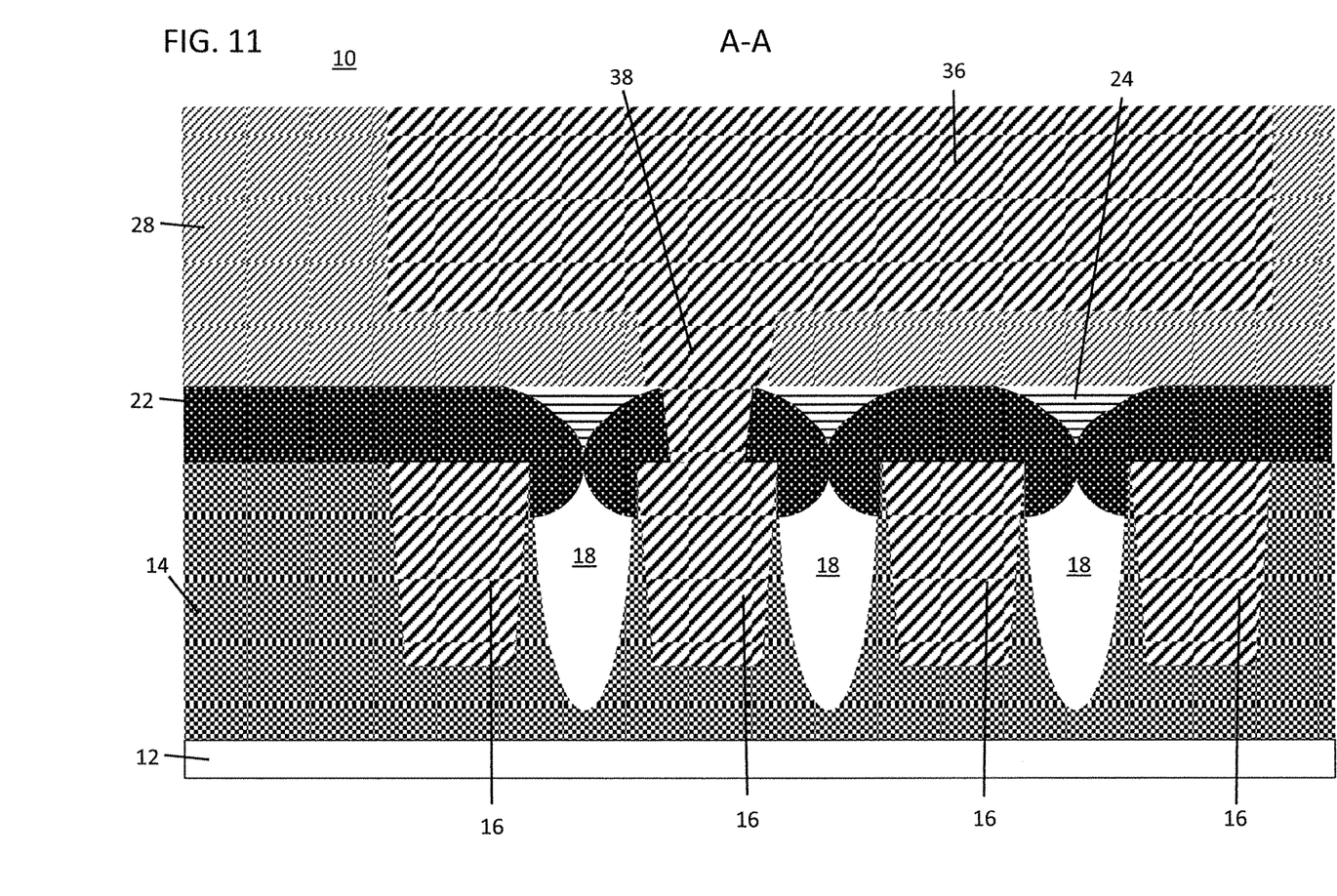
FIG. 11 is a cross-sectional view taken at section line A-A of FIG. 10 showing an interconnect layer and a next metallization layer in accordance with the present principles.

Referring to FIG. 11, a cross-sectional view taken and section line A-A in FIG. 10 is illustratively shown. The section A-A is centered on the metal line 36 and goes through the via 38. Since the section A-A is centered on line 36, some ILD 28 remains on the protection layer 24 and the pinch off layer 22. Off-center from A-A may include less ILD 24 material until the cross section B-B is achieved as depicted in FIG. 12.

Figure 12:
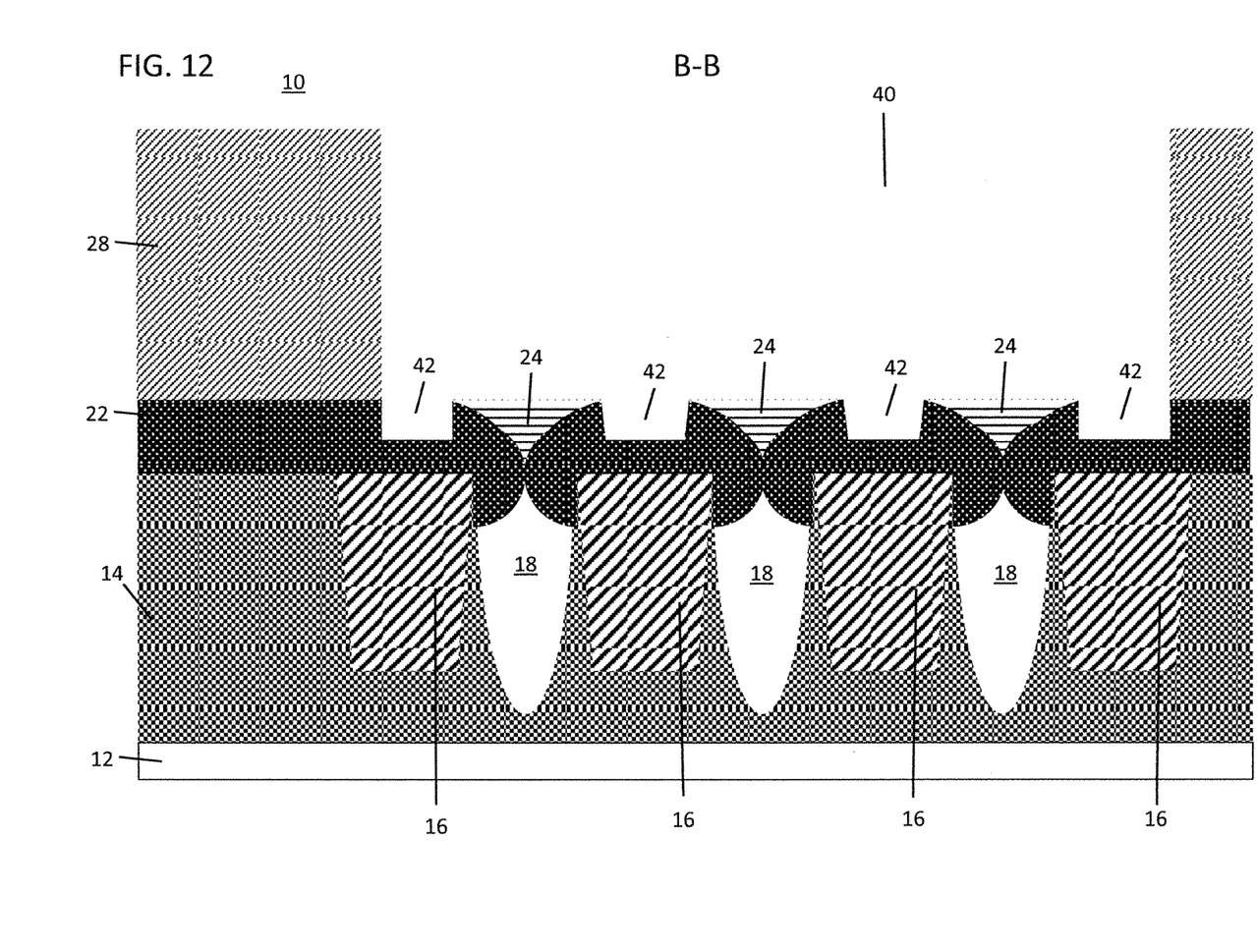
FIG. 12 is a cross-sectional view taken at section line B-B of FIG. 11 showing airgaps between the next metallization layer metal lines in accordance with the present principles.

Referring to FIG. 12, a cross-sectional view taken and section line B-B in FIG. 10 is illustratively shown. The section B-B is centered on the airgap 40 between and below (or partially below) the metal lines 36. Since the section B-B is centered between metal lines 36, the pinch off layer 22 is exposed to the airgap etch to form airgaps 40, and therefore shallow trenches 42 are formed where the pinch off layer 22 is not protected by protection layer 24. The protection layer 24 ensures that the airgaps 18 remain separated from airgaps 40.

Figure 13:
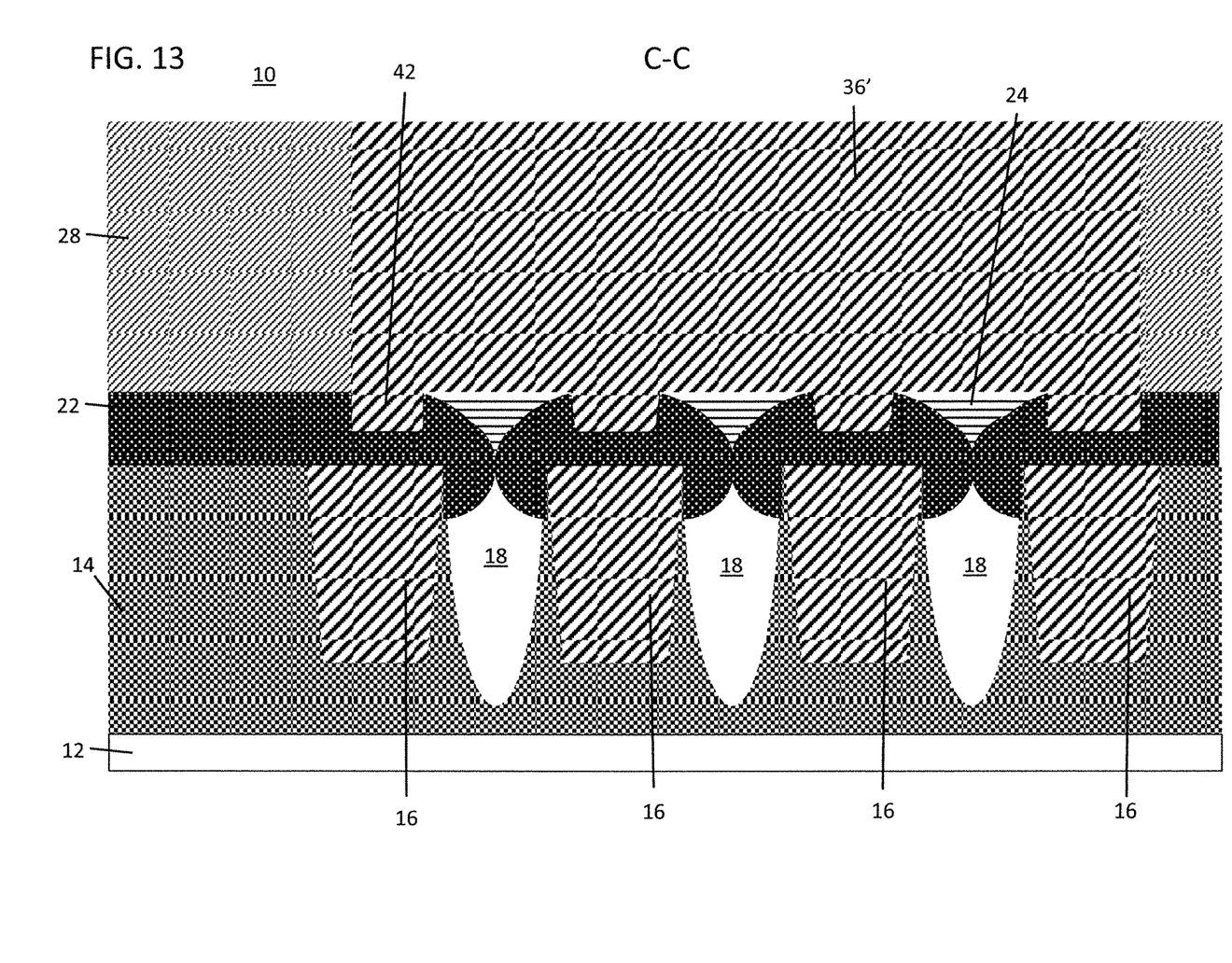
FIG. 13 is a cross-sectional view taken at section line C-C of FIG. 11 showing a metallization formed after airgaps are etched between the next metallization layer metal lines in accordance with the present principles.

Referring to FIG. 13, a cross-sectional view taken and section line C-C in FIG. 10 is illustratively shown. The section C-C is formed on a metal line 36', which may be formed after the etch of airgap 40. The pinch off layer 22 was exposed to the airgap etch to form airgaps 40, and therefore shallow trenches 42 are formed where the pinch off layer 22 was not protected by protection layer 24. The shallow trenches 42 are filled with conductive material of the metal line 36'.

Figure 14:
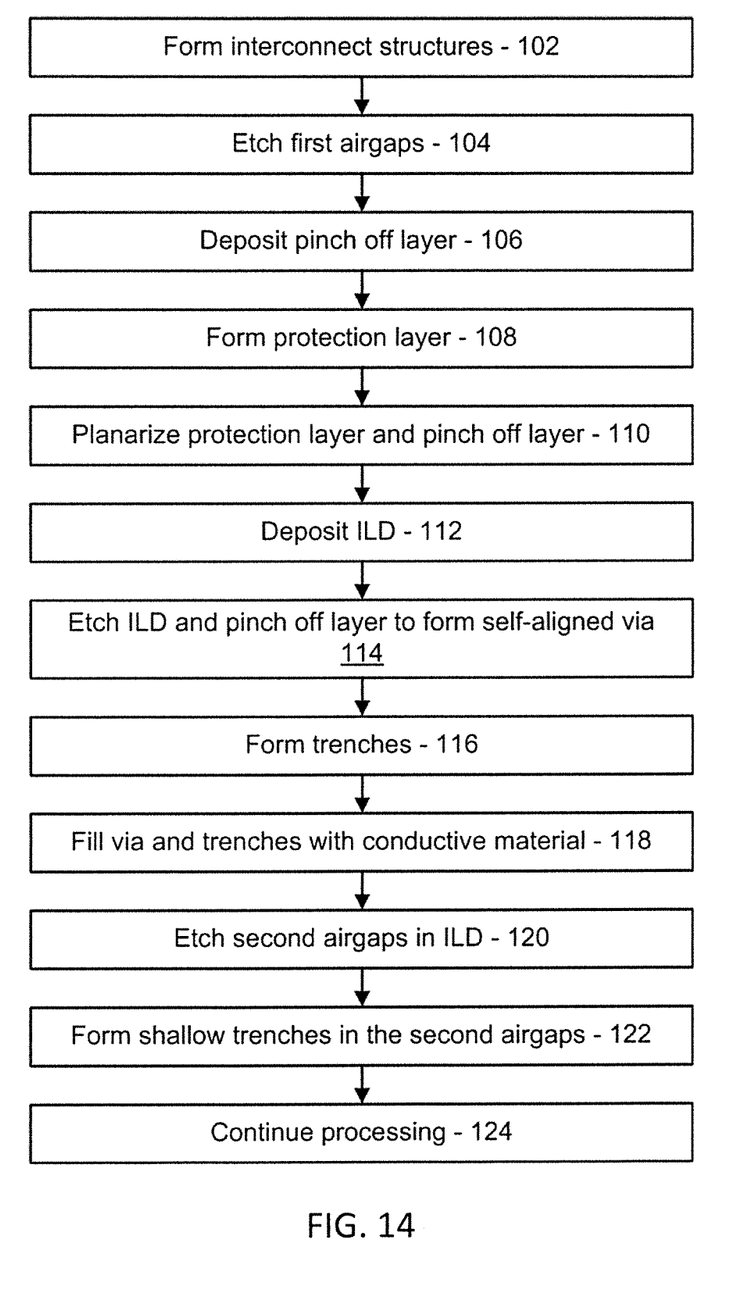
FIG. 14 is a block/flow diagram showing methods for forming a semiconductor device with airgaps and a self-aligned via in accordance with illustrative embodiments.

Referring to FIG. 14, methods for via alignment are illustratively shown in accordance with the present principles. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, interconnect structures are formed in a first dielectric layer. The first dielectric layer may include an ILD or other dielectric layer. The interconnect structure may include vias/contacts or other metal structures (metallization). The dielectric layer with the interconnect structures may include a device layer or any other layer in the structure.

In block 104, first airgaps are etched between the interconnect structures. The first airgaps may be formed by selective etching relative to the interconnect structures. In one embodiment, an etch mask may be employed to provide an etch pattern for forming the airgaps. In block 106, a pinch off layer is deposited to close off openings to the first airgaps. The pinch off layer may include a nitride, e.g., AlN. In block 108, a protection layer is formed over the pinch off layer in divots formed in the pinch off layer.

In block 110, the protection layer and the pinch off layer are planarized to form a surface where the protection layer remains in the divots. In block 112, an ILD is deposited on the surface. In block 114, the ILD and the pinch off layer are etched using the protection layer as an etch stop to align a via and expose the interconnect structure through the via. The etch stop (protection layer) guides the formation of the via by resisting the etch. The via is self-aligned to the interconnect structure and avoids the airgap regions between the interconnect structures.

In block 116, in one embodiment, trenches may be formed in the ILD with at least one trench in communication with the via. The trenches may be employed for forming metallizations in communication with the via or vias. In block 118, a conductive material is deposited in the via and the trenches (if present) to form the metallization structures for the next level. In block 120, second airgaps are etched between the metallization structures in the trenches. In block 122, shallow trenches are formed in areas exposed in the pinch off layer as part of the second airgaps wherein the areas exposed are not protected by the protection layer. In block 124, processing continues with the formation of additional metallizations and layers as needed.

Having described preferred embodiments for an airgap protection layer for via alignment (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for via alignment, comprising:
   depositing a pinch off layer to close off openings to first airgaps between interconnect structures;
   forming a protection layer in divots formed in the pinch off layer; and
   etching the pinch off layer using the protection layer as an etch stop to form and align a via and expose the interconnect structures through the via.

2. The method as recited in claim 1, wherein forming the first airgaps between interconnect structures includes selectively etching a dielectric material disposed between the interconnect structures.

3. The method as recited in claim 1, wherein the protection layer includes a nitride.

4. The method as recited in claim 1, wherein the protection layer includes an aluminum nitride.

5. The method as recited in claim 1, further comprising forming a trench in an ILD in communication with the via.

6. The method as recited in claim 5, further comprising depositing a conductive material in the trench and the via.

7. The method as recited in claim 6, further comprising etching second airgaps between conductive materials formed in trenches.

8. The method as recited in claim 7, further comprising forming shallow trenches in areas exposed in the pinch off layer as part of the second airgaps wherein the areas exposed are not protected by the protection layer.

9. A method for via alignment, comprising:
   etching first airgaps between interconnect structures in a first dielectric layer;
   depositing a pinch off layer to close off openings to the first airgaps;
   forming a protection layer in divots formed in the pinch off layer;
   etching the pinch off layer using the protection layer as an etch stop to form and align a via and expose the interconnect structures through the via;
   forming trenches in an ILD with at least one trench in communication with the via;
   depositing a conductive material in the trenches and the via; and
   etching second airgaps between the trenches.

10. The method as recited in claim 9, wherein forming the first airgaps between interconnect structures includes selectively etching a dielectric material between the interconnect structures.

11. The method as recited in claim 9, wherein the protection layer includes a nitride.

12. The method as recited claim 9, wherein the protection layer includes an aluminum nitride.

13. The method as recited in claim 9, further comprising forming shallow trenches in areas exposed in the pinch off layer as part of the second airgaps wherein the areas exposed are not protected by the protection layer.

14. A semiconductor device, comprising:
   a pinch off layer formed to close off openings to first airgaps between interconnect structures in a first dielectric layer;
   an interlevel dielectric layer (ILD) formed over a planarized surface of the pinch off layer and a protection layer formed in divots in the pinch off layer; and
   a via opening formed between portions of the protection layer to align the via opening with the interconnect structure.

15. The device as recited in claim 14, wherein the first airgaps extend to a depth beyond the interconnect structures.

16. The method as recited in claim 14, wherein the protection layer includes an aluminum nitride.

17. The device as recited in claim 14, further comprising a trench formed in the ILD in communication with the via and being filled with a conductive material in the via and the trench to form a contact and metal line, respectively.

18. The device as recited in claim 17, further comprising second airgaps formed transversely to the first airgaps in between adjacent metal lines.

19. The device as recited in claim 18, further comprising: shallow trenches formed in areas exposed in the pinch off layer as part of the second airgaps wherein the areas exposed are not protected by the protection layer.

20. The device as recited in claim 14, further comprising a separation barrier formed from the pinch off layer and the protection layer between the first airgaps and the second airgaps.

* * * * *